(12) United States Patent  
Arnold et al.

(10) Patent No.: US 9,577,630 B2  
(45) Date of Patent: Feb. 21, 2017

(54) ADAPTIVE SYSTEM CONTROLLED POWER SUPPLY TRANSIENT FILTER

(71) Applicant: TEXAS INSTRUMENTS DEUTSCHLAND GMBH, Freising (DE)

(72) Inventors: Matthias Arnold, Freising (DE); Ruediger Kuhn, Freising (DE); Johannes Gerber, Unterschleissheim (DE)

(73) Assignee: TEXAS INSTRUMENTS DEUTSCHLAND GMBH, Freising (DE)

( * ) Notice: Subject to any disclaimer, the term of this patent is extended or adjusted under 35 U.S.C. 154(b) by 211 days.

(21) Appl. No.: 14/317,094

(22) Filed: Jun. 27, 2014

(65) Prior Publication Data

US 2015/0381137 A1    Dec. 31, 2015

(51) Int. Cl.
*G06F 1/30* (2006.01)
*H03K 17/22* (2006.01)
*G06F 1/32* (2006.01)

(52) U.S. Cl.
CPC ............... *H03K 17/22* (2013.01); *G06F 1/305* (2013.01); *G06F 1/32* (2013.01)

(58) Field of Classification Search
CPC ............. G06F 1/30; G06F 1/305; G06F 1/32; G06F 1/3243
USPC ......................................... 327/142, 143, 198
See application file for complete search history.

(56) References Cited

U.S. PATENT DOCUMENTS 5,841,269 A * 11/1998 Schoonmaker ......... G06F 1/305
                                                          323/276
6,642,757 B2 * 11/2003 Ikehashi ................ G11C 5/143
                                                          327/142

\* cited by examiner

*Primary Examiner* — Patrick O'Neill
(74) *Attorney, Agent, or Firm* — John R. Pessetto; Charles A. Brill; Frank D. Cimino

(57) ABSTRACT

An electronic device that includes a power on reset, a variable power supply filter coupled to the power on reset, and control logic coupled to the power on reset and the variable power supply filter. The control logic is configured to activate the variable power supply filter based on a core domain of the electronic device being active.

20 Claims, 2 Drawing Sheets

ADAPTIVE SYSTEM CONTROLLED POWER SUPPLY TRANSIENT FILTER

CROSS-REFERENCE TO RELATED APPLICATION

None.

BACKGROUND

Mobile electronic devices and systems require testing to determine the susceptibility of the electronic devices to electrostatic discharge (ESD) from human contact. Current testing requires the electronic device, such as a microcontroller, to be stressed with up to 10 kV. That amount of stress may cause very fast power transients in the power supply which may affect the function of the power on reset of the electronic device. Because the power fluctuations caused by the power transients during normal operation may cause the power on reset to send an unwanted reset impulse to the remaining components of the electronic device, the device may unintentionally reset. While power transients may negatively affect the functionality of the power on reset, today's low power digital designs do require power transients during start up because low power digital designs require steep power ramps for proper operation.

SUMMARY

The problems noted above are solved in large part by systems and methods for an adaptive controlled power supply transient filter coupled to a power on reset. In some embodiments, an electronic device that includes a power on reset, a variable power supply filter coupled to the power on reset, and control logic coupled to the power on reset and the variable power supply filter. The control logic is configured to activate the variable power supply filter based on a core domain of the electronic device being active.

Another illustrative embodiment includes a method that comprises receiving a power on reset signal. The method also includes resetting an electronic device. The method continues with, based on a core domain of the electronic device being active, activating a power supply filter coupled to a power on reset.

Yet another illustrative embodiment is a system including a low pass filter, a power on reset coupled to the low pass filter, a voltage reference coupled to the low pass filter and power on reset, and control logic coupled to the power on reset, low pass filter, and voltage reference. The power on reset is configured to reset an electronic device. The voltage reference is configured to produce a fixed voltage The control logic is configured to adjust bandwidth of the low pass filter based on the voltage reference producing the fixed voltage.

BRIEF DESCRIPTION OF THE DRAWINGS

For a detailed description of exemplary embodiments of the invention, reference will now be made to the accompanying drawings in which.

NOTATION AND NOMENCLATURE

Figure 1:
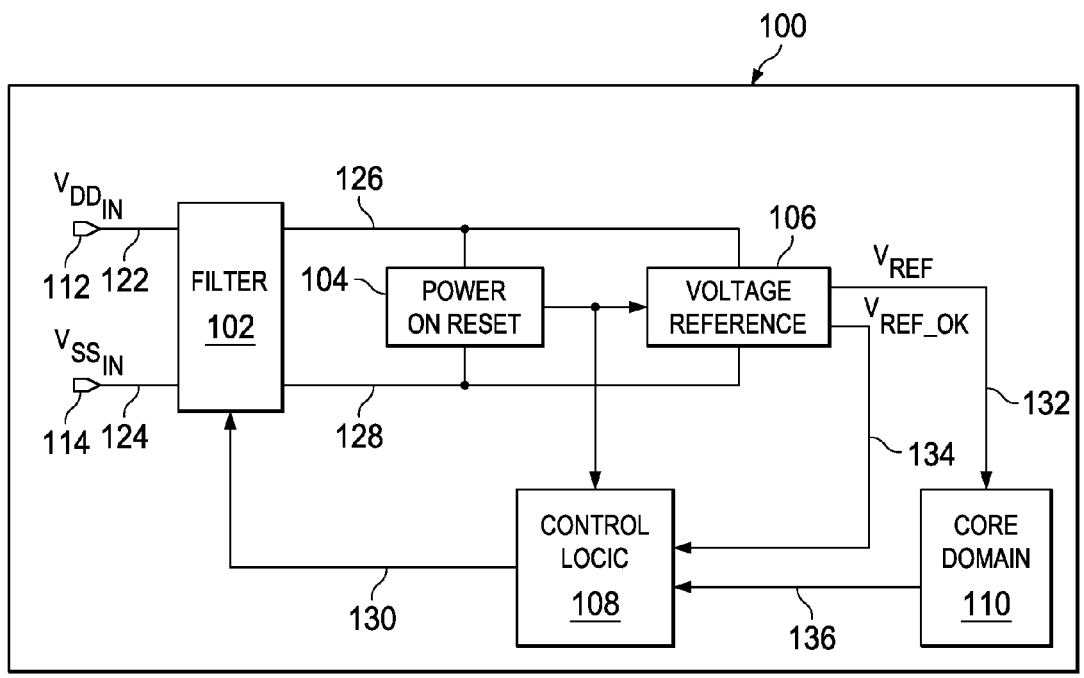
FIG. 1 shows a block diagram of an illustrative an electronic device comprising an adaptive system controlled power supply transient filter in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. Further, the term "software" includes any executable code capable of running on a processor, regardless of the media used to store the software. Thus, code stored in memory (e.g., non-volatile memory), and sometimes referred to as "embedded firmware," is included within the definition of software. The recitation "based on" is intended to mean "based at least in part on." Therefore, if X is based on Y, X may be based on Y and any number of other factors.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

The demand for low power solutions in mobile electronic devices, such as microcontrollers, is increasing. As part of the certification process for these electronic devices, an electrostatic discharge (ESD) test must be performed in order to ensure that the devices are safe for humans to operate. As part of the ESD test, a large stress is applied to the electronic device while the electronic device is in operation. The stress can be as high as 10 kV. The stress applied to the electronic device may cause very fast power transients. A power transient is a short-lived burst of energy, usually appearing as an oscillation, caused by a sudden change of state. While the electronic device is in normal operation, these power transients, due to the sudden burst of energy, may cause the power on reset to reset the components of the electronic device even though such a reset may be unwanted. Because the stress is continuously applied and further power transients will be in the system, the power on reset may cause unwanted resets on numerous occasions. Thus, a need exists to reduce the impact of these power transients during normal operations of the electronic device.

However, while the power transients are unwanted during normal operations, power transients are desirable during start up and initial power ramp of the electronic device. A power ramp is the way in which the voltage increases within the electronic device at start up or after a reset. Because low power systems benefit, and sometimes require, a steep power ramp, power transients are desirable during start up and during the power ramp of the electronic device.

By utilizing an adaptive power supply filter, power transients may be present for a power ramp while being dampened and/or removed during normal operation of the electronic device. The power supply filter may be initially configured to have a bandwidth in a first state. In some embodiments, that means utilizing a low pass filter as the power supply filter and configuring the low pass filter with a high bandwidth, such that the power transients are not damped. This allows for the power transients to be present in the electronic device, and thus, help with the power ramp. Once the electronic device is fully ramped, and the core domains of the electronic device are active, the power supply filter's configuration may be adjusted. More specifically, the power supply filter may be configured to adjust the bandwidth of the power supply filter to be in a second state. In some embodiments, this means that the low pass filter's bandwidth is lowered such that power transients are damped to the point where the power on reset will not cause a reset. Thus, an electronic device that utilizes this adaptive power supply filter may allow power transients in the system when required while damping power transients during normal operations.

FIG. 1 shows a block diagram of an illustrative electronic device 100 comprising an adaptive system controlled power supply transient filter 102 in accordance with various embodiments. In an embodiment electronic device 100 is a microcontroller. The electronic device 100 includes power supply filter 102, power on reset 104, voltage reference 106, control logic 108, core domain 110, and power supply pins 122 and 124. Power supply pin 112 is a transistor pin that connects the electronic device 100 to an input high supply power rail which is labelled $V_{DDin}$ in FIG. 1, while power supply pin 114 is a transistor pin that connects the electronic device 100 to the input low supply power rail which is labelled $V_{SSin}$ in FIG. 1. Thus, voltage 122 is the high supply voltage while voltage 124 is the low supply voltage to power electronic device 100. At high voltages, very fast transients may be observed in voltages 122 and 124.

Power supply filter 102 is designed to remove unwanted frequency components that sometimes may be present in voltages 122 and 124. In some embodiments, power supply filter 102 is a variable power supply filter and more specifically, in some embodiments, power supply filter 102 is a low pass filter. As a low pass filter, power supply filter 102 may be designed to allow frequency signals within a specified bandwidth to pass while attenuating, or damping, frequencies outside the bandwidth. Power supply filter 102 may be comprised of one or more capacitors and one or more resistors and/or inductors. The bandwidth of power supply filter 102 is dynamically adjustable.

Power on reset 104 is coupled to power supply filter 102 and receives the voltages 126 and 128 as power. Voltage 126 is the filtered voltage 122 while voltage 128 is the filtered voltage 124. In other words, voltage 126 is the voltage signal after voltage 122 passes through power supply filter 102, even if power supply filter 102 does nothing to voltage 122. Similarly, voltage 128 is the voltage signal after voltage 124 passes through power supply filter 102 even if power supply filter 102 does nothing to voltage 122. Power on reset 104 is a component of electronic device 100 which generates a reset impulse to all of the components of electronic device 100 based on a threshold amount of power being applied to power on reset 104. The reset impulse causes all of the components to enter into a known state.

In an embodiment, power on reset 104 is comprised of one or more capacitors in series with one or more resistors. Power on reset 104 may utilize the charging of a capacitor to measure the time period during which the electronic device 100 is held in the reset state. Once the rising voltage in power on reset 104 reaches a threshold voltage, a Schmitt trigger may be utilized to deassert the reset signal.

Voltage reference 106 is coupled to power supply filter 102 and power on reset 104 and is supplied with power by voltages 126 and 128. Voltage reference 106 is a component of electronic device 100 that may be configured to produce a fixed voltage 132, which is labelled $V_{REF}$, to other components of electronic device 100, such as core domain 110. Voltage reference 106 may be a bandgap voltage reference, or may be any other voltage reference. Once power on reset 104 generates a reset impulse, voltage reference 106 ramps up voltage 132 from zero until it reaches the designed reference voltage. Once voltage 132 reaches the designed reference voltage, a signal 134 ($V_{REF\_OK}$), is transmitted to control logic 108.

Core domain 110 is a domain within electronic device 100 which provides core functionality to electronic device 100, such as processing capabilities. Core domain 110 receives voltage 132 from voltage reference 106 as its supply power. In one example, core domain 110 includes a central processing unit. Core domain 110 also may transmit signal 136 to control logic 108. Signal 136 provides an indication that core domain 110 is active and is being powered by voltage 132.

Control logic 108 is coupled to power supply filter 102, power on reset 104, and voltage reference 106. Control logic 108 receives signal 134 from voltage reference 106 as well as signal 136 from core domain 110. Control logic 108 may control the filtering characteristics of power supply filter 102 by transmitting control signal 130 to power supply filter 102.

In an embodiment, power supply filter 102 is configured by control logic 102 with a bandwidth in a first state during power ramp, or when power supply filter 102 initially receives voltages 122 and 124 and when core domain 110 is inactive. In other words, power supply filter 102 is configured such that the transients in voltages 122 and 124 are not damped during power ramp. In an embodiment, power supply filter 102, as a low pass filter, is configured by control logic 108 with a high bandwidth such that power transients are not damped by power supply filter 102. This also enables a steep power ramp.

In an embodiment, once, however, signal 134 indicates to control logic 108 that voltage 132 has reached the designated reference voltage, control logic 108, through control signal 130 causes power supply filter 102 to adjust its bandwidth to a second state. In other words, control logic 108 causes power supply filter 102 to begin to dampen the power transients from voltages 122 and 124. In alternative embodiments, control logic 108 causes power supply filter 102 to adjust its bandwidth to a second state once control logic 108 receives signal 136 indicating that core domain 136 is active or after a threshold amount of time has passed from reset.

In order to adjust its bandwidth to a second state power supply filter 102, in an embodiment, once control logic 108 receives signal 134, control logic 108 causes the bandwidth of power supply filter 102, acting as a low pass filter, to be lowered, such that power transients in voltages 122 and 124 are dampened. Because the bandwidth has been lowered, power transients that cause a frequency in voltages 122 and 124 that would fall outside of the bandwidth would be dampened by power supply filter 102. In alternative embodiments, the bandwidth is lowered once control logic 108 receives signal 136 indicating that core domain 136 is active or after a threshold amount of time has passed from reset.

Control logic 108 is programmable. Therefore, a user may configure control logic 108 with the bandwidth that power supply filter 102 is to be set when power supply filter 102 is in its first state and the bandwidth that power supply filter 102 is to be set when power supply filter 102 is in its second state.

Because power supply filter 102 is allowing power transients to pass when power supply filter 102 originally receives voltages 122 and 124 and during reset, the power ramp is fast. Once the power supply filter's 102 bandwidth is adjusted lower, the power supply filter 102 dampens any power transients in voltages 122 and 124, thus, power on reset 104 receives voltages 126 and 128 without large power transients. This prevents power on reset 104 from receiving the spike in voltage, in the form of power transients, that might cause power on reset to send a reset impulse to electronic device 100.

Figure 2:
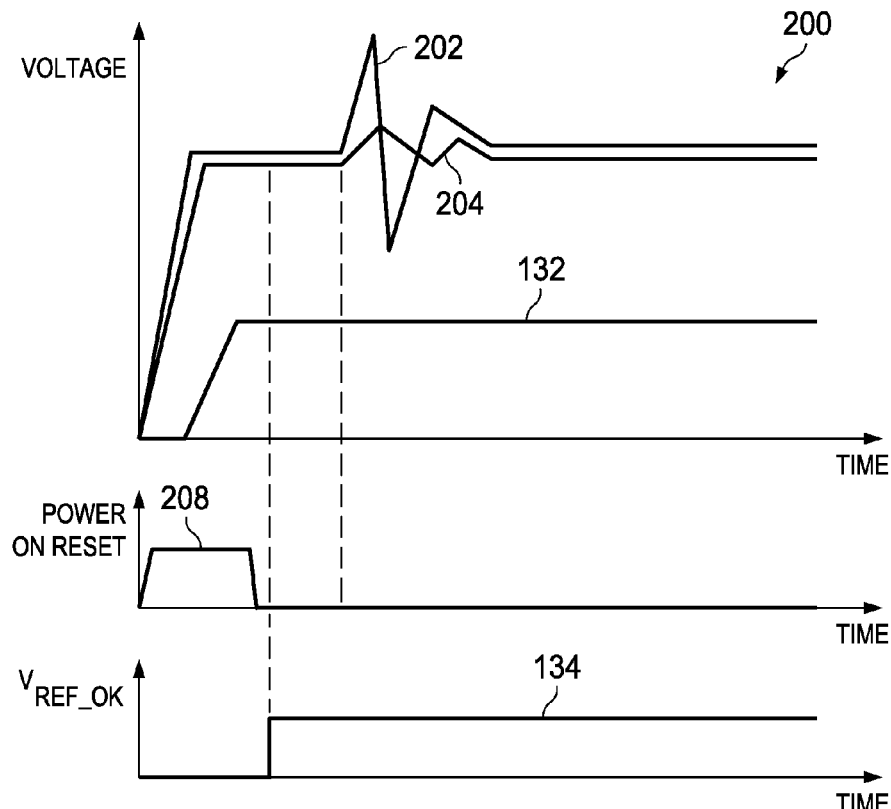
FIG. 2 shows example voltage levels in an electronic device comprising an adaptive system controlled power supply transient filter in accordance with various embodiments.

FIG. 2 shows example voltage levels 200 in an electronic device 100 comprising an adaptive system controlled power supply transient filter 102 in accordance with various embodiments. Voltage curve 202 is an exemplary representation of voltage 122 over time upon reset impulse 208 being transmitted by power on reset 104 to electronic device 100. At this time, power supply filter 102 is configured by control logic 108 to allow power transients to pass. In an embodiment, power supply filter 102 allows power transients to pass because control logic 108 configures the bandwidth of power supply filter 102 to be high enough that power transients are allowed to pass through power supply filter 102 without damping of the voltage. Because power transients are not damped during this time period, there is a fast power ramp slope to curve 202. Additionally, there is a fast $V_{REF}$ voltage 132 startup as well.

In an embodiment, after control logic 108 receives $V_{REF\_OK}$ signal 134, power supply filter's 102 bandwidth is adjusted. In alternative embodiments, power supply filter's 102 may be adjusted after receiving signal 136 indicating that core domain 110 is active or after a threshold amount of time has passed from the power on reset impulse 208 being transmitted to the components of electronic device 100. In an embodiment, power supply filter's 102 bandwidth is adjusted by control logic 108 through control signal 130 which causes the bandwidth of power supply filter 102 to narrow, or lower, such that power transients are damped by power supply filter 102. In other words, control logic 108 may lower the bandwidth of power supply filter 102 such that power transients are damped by power supply filter 102.

Voltage curve 204 is an exemplary representation of voltages 122 and 124 over time after power supply filter's 102 bandwidth has been adjusted such that power transients are damped. While there is a power transient in voltage 122, as shown in voltage curve 202, power supply filter 102 damps the frequency of that power transient. Because the power transients are damped, the power on reset 104 does not receive the threshold amount of power to cause an unintentional reset.

Figure 3:
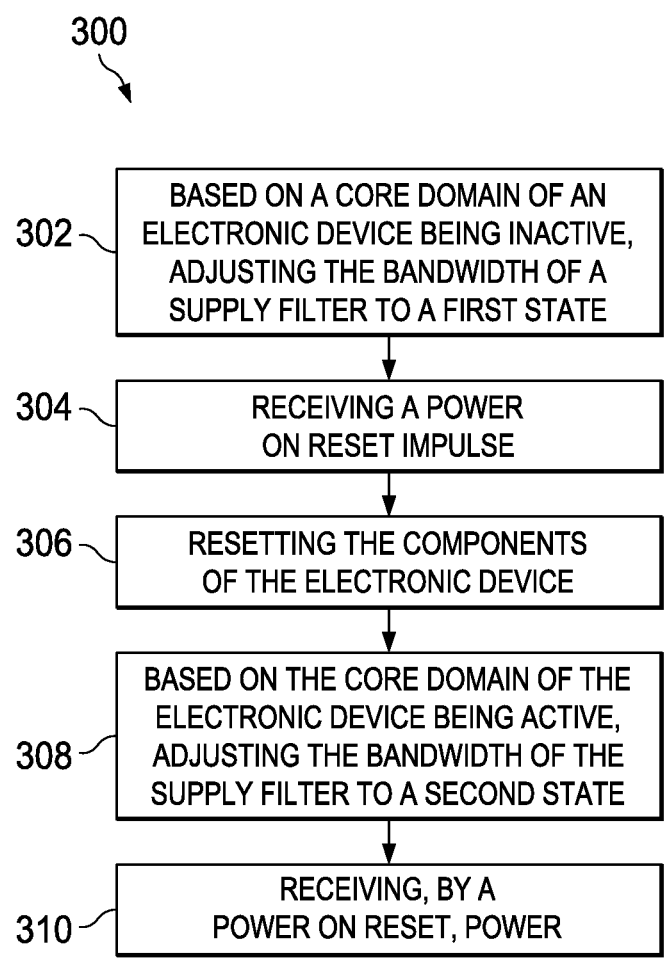
FIG. 3 shows a flow diagram of an adaptive system controlled power supply transient filter method in accordance with various embodiments.

FIG. 3 shows a flow diagram of an adaptive system controlled power supply transient filter method 300 in accordance with various embodiments. Though depicted sequentially as a matter of convenience, at least some of the actions shown can be performed in a different order and/or performed in parallel. Additionally, some embodiments may perform only some of the actions shown. In some embodiments, at least some of the operations of the method 300, as well as other operations described herein, can be performed by control logic 108 and implemented by a processor executing instructions stored in a non-transitory computer readable storage medium.

The method begins in block 302 with, based on a core domain 110 of electronic device 100 being inactive, adjusting the bandwidth of a power supply filter 102 to a first state. In an embodiment, power supply filter's 102 bandwidth is adjusted to a first state by causing the bandwidth of power supply filter 102 to be high enough such that power transients are allowed to pass through power supply filter 102 without damping of the voltage. Electronic device 100 may be a microcontroller.

In block 304, method 300 continues with receiving a power on reset impulse. The power on reset impulse may be generated by power on reset 104 and may be received by the remaining components of electronic device 100.

In block 306, method 300 continues with resetting the components of electronic device 100. This may cause all of the components of electronic device 100 to enter into a known state. The resetting of the components of electronic device 100 may be caused by power on reset 104 receiving a threshold amount of power.

In block 308, method 300 continues with, based on core domain 110 of electronic device 100 being active, adjusting power supply filter's 102 bandwidth to a second state. In an embodiment, power supply filter's 102 is adjusted to a second state by causing a lowering or narrowing of the bandwidth of power supply filter 102 such that power transients are damped by power supply filter 102. The amount the bandwidth of power supply filter 102 is narrowed may be programmable. In block 310, method 300 continues with receiving, by power on reset 104, power. The power may be in the form of voltage 126.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An electronic device, comprising:
   a power on reset;
   a variable power supply filter coupled to the power on reset; and
   control logic coupled to the power on reset and the variable power supply filter, the control logic configured to transmit a control signal to the variable power supply filter causing the variable power supply filter to adjust a bandwidth of the variable power supply filter based on a core domain of the electronic device being active.

2. The system of claim 1, wherein the variable power supply filter is a low pass filter.

3. The system of claim 1, wherein the control signal causes the bandwidth of the variable power supply filter to lower based on the core domain of the electronic device being active.

4. The system of claim 3, wherein the bandwidth of the variable power supply filter is lowered such that power transients are damped by the variable power supply filter.

5. The system of claim 1, wherein, based on the core domain of the electronic device being inactive, the variable power supply filter is set with a bandwidth such that power transients are not damped by the variable power supply filter.

6. The system of claim 1, wherein the control logic is programmable.

7. The system of claim 1, wherein the electronic device is a microcontroller.

8. The system of claim 1, wherein the power on reset is configured to reset the electronic device when a threshold amount of power is applied to the power on reset.

9. A method, comprising:
    receiving a power on reset impulse;
    resetting an electronic device; and
    based on a core domain of the electronic device being active, adjusting a bandwidth of a power supply filter coupled to a power on reset to a first state.

10. The method of claim 9, wherein the adjusting the bandwidth of the power supply filter to a first state comprises lowering the bandwidth of the power supply filter such that power transients are damped by the power supply filter.

11. The method of claim 9, further comprising, based on the core domain of the electronic device being inactive, adjusting the bandwidth of the power supply filter to a second state.

12. The method of claim 11, wherein the adjusting the bandwidth of the power supply filter to a second state comprises raising the bandwidth such that power transients are not damped by the power supply filter.

13. The method of claim 9, wherein the electronic device is a microcontroller.

14. The method of claim 9, further comprising, receiving, by the power on reset, power, and wherein the resetting the electronic device comprises resetting the electronic device based on the power on reset receiving a threshold amount of power.

15. A system comprising:
    a low pass filter;
    a power on reset coupled to the low pass filter, the power on reset configured to reset an electronic device;
    a voltage reference coupled to the low pass filter and power on reset, the voltage reference configured to produce a fixed voltage; and
    control logic coupled to the power on reset, low pass filter, and voltage reference, the control logic configured to transmit a control signal to the low pass filter causing the low pass filter to adjust a bandwidth of the low pass filter based on the voltage reference producing the fixed voltage.

16. The system of claim 15, wherein the control signal causes the bandwidth of the low pass filter to lower based on the voltage reference producing the fixed voltage such that power transients are damped by the low pass filter.

17. The system of claim 15, wherein, based on the voltage reference not producing the fixed voltage, the low pass filter is set with a bandwidth such that power transients are not damped by the low pass filter.

18. The system of claim 15, wherein the threshold amount of time is programmable.

19. The system of claim 15, wherein the electronic device is a microcontroller.

20. The system of claim 15, wherein the power on reset is configured to reset the electronic device based on a threshold amount of power being applied to the power on reset.

* * * * *